United States Patent
Bang et al.

(10) Patent No.: US 8,815,613 B2
(45) Date of Patent: Aug. 26, 2014

(54) METHOD OF MANUFACTURING TOUCH SENSING PANEL

(71) Applicant: Samsung Display Co., Ltd., Yongin (KR)

(72) Inventors: Hyun-Sung Bang, Yongin (KR); Won-Jong Kim, Yongin (KR); Ji-Young Choung, Yongin (KR); Joon-Gu Lee, Yongin (KR); Jin-Baek Choi, Yongin (KR); Yeon-Hwa Lee, Yongin (KR); Young-Woo Song, Yongin (KR); Jong-Hyuk Lee, Yongin (KR)

(73) Assignee: Samsung Display Co., Ltd. (KR)

( * ) Notice: Subject to any disclaimer, the term of this patent is extended or adjusted under 35 U.S.C. 154(b) by 3 days.

(21) Appl. No.: 13/767,616

(22) Filed: Feb. 14, 2013

(65) Prior Publication Data

US 2014/0120634 A1    May 1, 2014

(30) Foreign Application Priority Data

Oct. 25, 2012   (KR) ................. 10-2012-0119066

(51) Int. Cl.
*H01L 21/00*   (2006.01)
(52) U.S. Cl.
USPC ............................................... 438/3
(58) Field of Classification Search
None
See application file for complete search history.

(56) References Cited

U.S. PATENT DOCUMENTS

| | | | |
|---|---|---|---|
| 6,538,917 B1 | 3/2003 | Tran et al. | |
| 7,027,320 B2 * | 4/2006 | Sharma | 365/158 |
| 2003/0122789 A1 | 7/2003 | Sharma | |
| 2005/0083728 A1 | 4/2005 | Sharma | |
| 2013/0076687 A1 * | 3/2013 | Giddings et al. | 345/174 |

FOREIGN PATENT DOCUMENTS

| | | |
|---|---|---|
| JP | 2005-149486 | 6/2005 |
| KR | 2003-0027689 | 4/2003 |
| KR | 2003-0058964 | 9/2009 |

* cited by examiner

*Primary Examiner* — Scott B Geyer
(74) *Attorney, Agent, or Firm* — Knobbe Martens Olson & Bear LLP (57) ABSTRACT

A method of manufacturing a touch sensing panel includes providing a substrate, forming a plurality of first electrodes arranged on the substrate, the first electrodes being separated from each other, forming a photoresist layer on the plurality of first electrodes, forming a plurality of photoresist removing regions positioned to intersect the first electrodes and to be separated from each other on the photoresist layer, and forming a tunneling magnetoresistance (TMR) element layer and a second electrode layer comprising a plurality of second electrodes on the photoresist layer. The method provides a touch sensing panel capable of being driven at high speed and reduces manufacturing cost and time.

16 Claims, 6 Drawing Sheets

METHOD OF MANUFACTURING TOUCH SENSING PANEL

CROSS-REFERENCE TO RELATED APPLICATIONS

This application claims priority to and the benefit of Korean Patent Application No. 10-2012-0119066, filed on Oct. 25, 2012, in the Korean Intellectual Property Office, the entire content of which is incorporated herein by reference.

BACKGROUND

1. Field

The present disclosure relates to a method of manufacturing a touch sensing panel capable of reducing manufacturing cost and manufacturing time.

2. Description of the Related Technology

A tunneling magnetoresistance (TMR) element in which the tunneling effect of electrons is used is most spotlighted as the material of a magnetic random access memory (MRAM) or a high density magnetic recording head.

The TMR element has a higher magnetoresistance ratio than a currently commercialized giant magnetoresistance element (GMR).

Using such a characteristic, the TMR element is potentially an element that may replace the GMR element widely used as the head material of a hard disk drive. In addition, it is possible to achieve a high degree of integration in a semiconductor memory field.

SUMMARY OF CERTAIN INVENTIVE ASPECTS

Embodiments of the present invention have been made to provide a method of manufacturing a touch sensing panel in which the memory characteristic of a tunneling magnetoresistance (TMR) pattern is removed so that it is not necessary to perform a refresh operation and that the touch sensing panel may be driven at high speed.

Embodiments of the present invention have also been made to provide a method of manufacturing a touch sensing panel in which a photolithography process is reduced so that the manufacturing cost and manufacturing time of the touch sensing panel may be reduced.

In order to achieve the foregoing and/or other aspects of the present invention, there is provided a method of manufacturing a touch sensing panel, including providing a substrate, forming a plurality of first electrodes arranged on the substrate to be separated from each other, forming a photoresist layer on the plurality of first electrodes, forming a plurality of photoresist removing regions positioned to intersect the first electrodes and to be separated from each other on the photoresist layer, and forming a tunneling magnetoresistance (TMR) element layer and a second electrode layer comprising a plurality of second electrodes on the photoresist layer.

The TMR element layer is divided into parts positioned on the photoresist layer and TMR patterns positioned on the first electrodes and the substrate through the photoresist removing regions.

The second electrode layer is divided into parts positioned in the photoresist layer and second electrodes positioned on the TMR patterns through the photoresist removing regions.

The method further includes forming a protective layer on the second electrode layer.

The photoresist removing regions include intersecting regions that intersect the first electrodes and coupling regions for coupling the intersecting regions to each other.

The intersecting regions have a first width in a first direction and a second width in a second direction, where the second width is larger than the first width.

The first width of the intersecting regions is perpendicular to the second width.

The intersecting regions are elliptical or diamond-shaped.

The TMR patterns are formed to have the same shape as the photoresist removing regions.

The second electrodes have the same shape as the TMR patterns.

The TMR patterns include first intersecting parts that intersect the first electrodes and first coupling parts for coupling the first intersecting parts to each other.

The first intersecting parts have a first width in a first direction and a second width in a second direction, where the second width is larger than the first width.

The first width is perpendicular to the second width.

The first intersecting parts are elliptical or diamond-shaped.

The second electrodes have the same shape as the TMR patterns.

The second electrode layer is positioned on the TMR element layer.

As described above, according to the present invention, it is possible to provide the method of manufacturing the touch sensing panel in which the memory characteristic of the TMR patterns is removed so that it is not necessary to perform the refresh operation and that the touch sensing panel may be driven at high speed.

In addition, according to the present invention, it is possible to provide the method of manufacturing the touch sensing panel in which the photolithography process is reduced so that the manufacturing cost and manufacturing time of the touch sensing panel may be reduced.

BRIEF DESCRIPTION OF THE DRAWINGS

The accompanying drawings, together with the specification, illustrate certain embodiments of the present invention, and, together with the description, serve to explain the principles of the present invention.

DETAILED DESCRIPTION OF CERTAIN INVENTIVE EMBODIMENTS

In the following detailed description, only certain embodiments of the present invention have been shown and described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals generally refer to like elements.

The advantages and characteristics of the present invention and a method of achieving the advantages and characteristics of the present invention now will be described more fully with reference to the accompanying drawings, in which certain embodiments of the invention are shown. This invention may, however, be embodied in many different forms and should not be construed as being limited to the embodiments set forth herein. In the drawings, when a part is coupled to another part, the part may be directly coupled to another part or the part may be electrically coupled to another part with another element interposed. In the drawings, any part that is not related to the present invention is omitted for clarity of description. The same reference numerals in different drawings represent the same element, and thus their description will not be repeated.

In the conventional digitizing device, since the TMR element is regular hexahedron-shaped, it is necessary to perform a refresh operation for initialization every time after a touch recognizing operation, efficiency deteriorates. Since the TMR element has a memory characteristic in the conventional digitizing device having a structure in which the conventional MRAM structure is simply applied to a touch sensor, an operation state is memorized after a touch sensing operation. In addition, in the conventional digitizing device, since a photolithography process is applied three times, process cost increases.

Hereinafter, a method of manufacturing a touch sensing panel will be described with reference to the embodiments of the present invention and the drawings.

Figure 1:
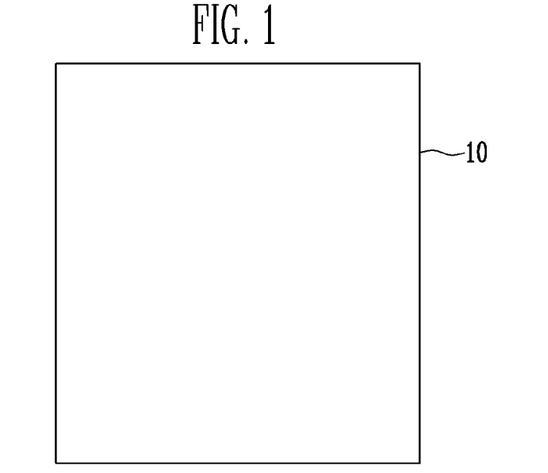
FIG. 1 is a view illustrating a substrate providing step in a method of manufacturing a touch sensing panel according to an embodiment of the present invention.

FIG. 1 is a view illustrating a substrate providing step in a method of manufacturing a touch sensing panel according to an embodiment of the present invention.

A method of manufacturing the touch sensing panel may include the substrate providing step. Referring to FIG. 1, in the substrate providing step, a substrate 10 is provided. For example, the substrate 10 may be formed of an insulating material such as glass, plastic, silicon, or synthetic resin. The substrate 10 may also be formed of a flexible film that may be curved or bent.

Figure 2A:
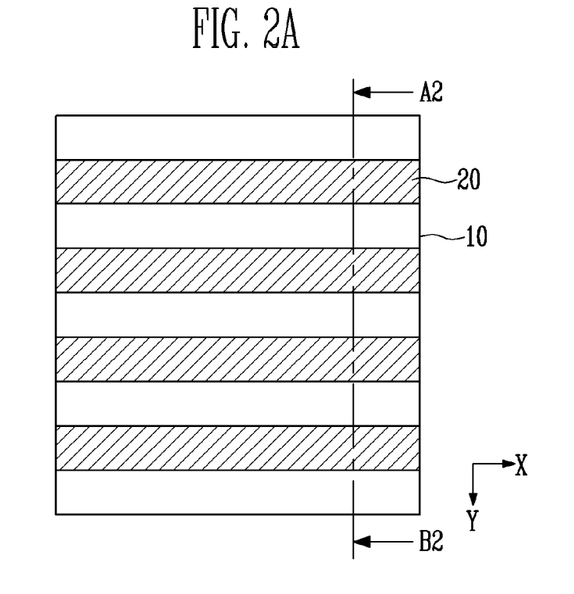
FIGS. 2A and 2B are views illustrating a first electrode forming step in the method of manufacturing the touch sensing panel according to the embodiment of the present invention.
Figure 2B:
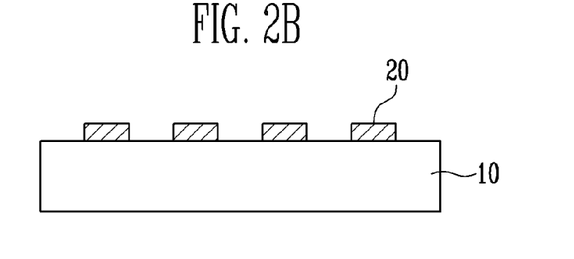

FIGS. 2A and 2B are views illustrating a first electrode forming step in the method of manufacturing the touch sensing panel according to the embodiment of the present invention. FIG. 2B illustrates the section of FIG. 2A taken along the line A2-B2.

In an embodiment of the method of manufacturing the touch sensing panel, after the above-described substrate providing step, the first electrode forming step may be performed.

Referring to FIGS. 2A and 2B, in the first electrode forming step, a plurality of first electrodes 20 arranged to be separated from each other may be formed on the substrate 10. The first electrode forming step may be performed through a common photolithography process.

For example, after entirely depositing a first electrode layer (not shown) and photoresist (not shown) on the substrate 10, a process of exposing and developing the photoresist using a mask (not shown) is performed so that the photoresist may be patterned.

Then, an etch process of removing a part of the first electrode layer exposed to the outside through the photoresist and a strip process of removing the photoresist may be performed. Therefore, as illustrated in FIGS. 2A and 2B, a plurality of first electrodes 20 may be formed.

For example, the plurality of first electrodes 20 may be longitudinally formed in a first direction (for example, an X axis direction) to be arranged in a second direction (for example, a Y axis direction) that intersects the first direction.

In addition, the first electrodes 20 are formed of a transparent conductive material in some embodiments. In other embodiments, the first electrodes 20 may be formed of another conductive material such as an opaque metal.

For example, the first electrodes 20 may be formed of indium tin oxide (ITO), indium zinc oxide (IZO), grapheme, carbon nanotube, and silver nanowires (AgNWs).

Figure 3A:
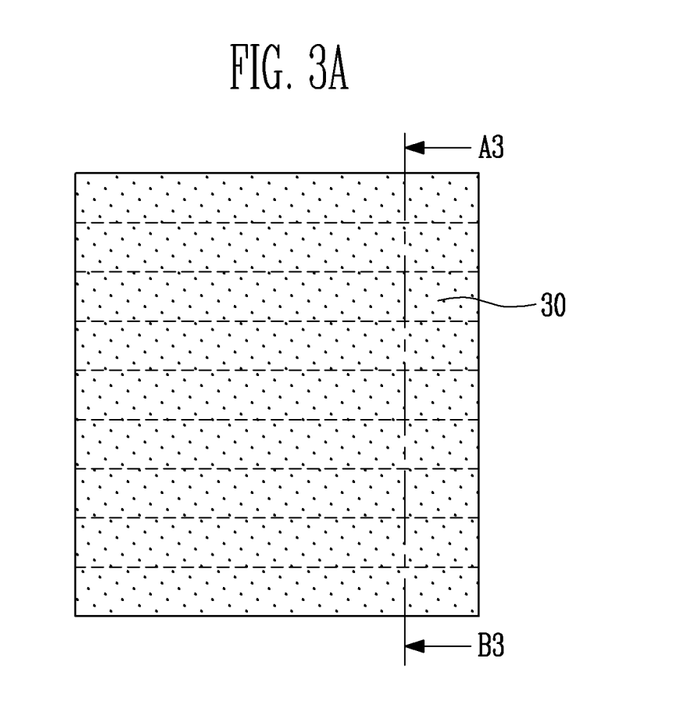
FIGS. 3A and 3B are views illustrating a photoresist layer forming step in the method of manufacturing the touch sensing panel according to the embodiment of the present invention.
Figure 3B:
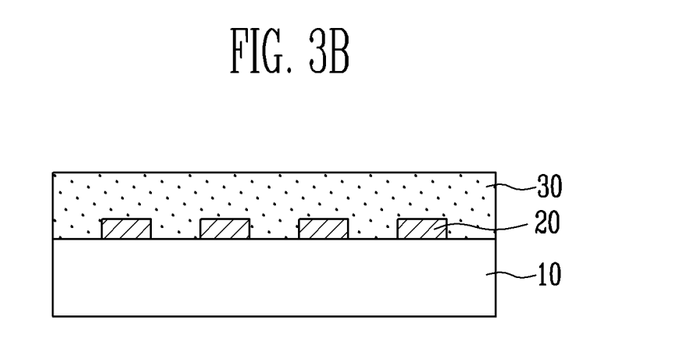

FIGS. 3A and 3B are views illustrating a photoresist layer forming step in the method of manufacturing the touch sensing panel according to an embodiment of the present invention. FIG. 3B illustrates the section of FIG. 3A taken along the line A3-B3.

In an embodiment of the method of manufacturing the touch sensing panel, after the above-described first electrode forming step, the photoresist layer forming step may be performed.

Referring to FIGS. 3A and 3B, in the photoresist layer forming step, a photoresist layer 30 may be laminated on the plurality of first electrodes 20. The photoresist layer 30 may be entirely formed on the substrate 10 and the first electrodes 20. In addition, the photoresist layer 30 may be formed of a negative type photoresist so that the bottom photoresist (on the substrate 10 side) may be etched more than the top photoresist.

Figure 4A:
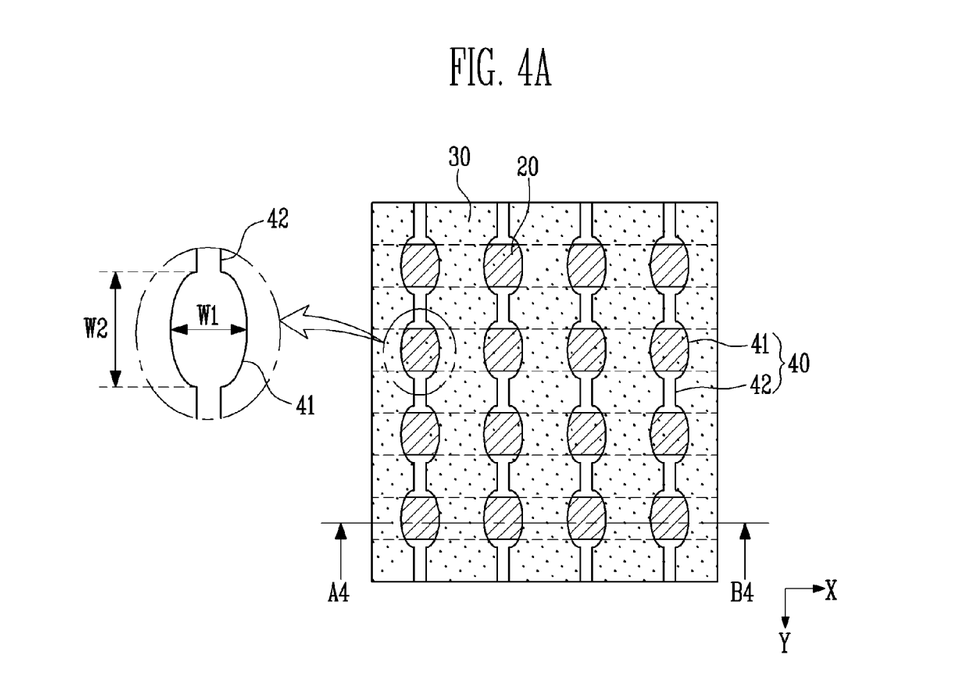
FIGS. 4A and 4B are views illustrating a photoresist removing region forming step in the method of manufacturing the touch sensing panel according to the embodiment of the present invention.
Figure 4B:
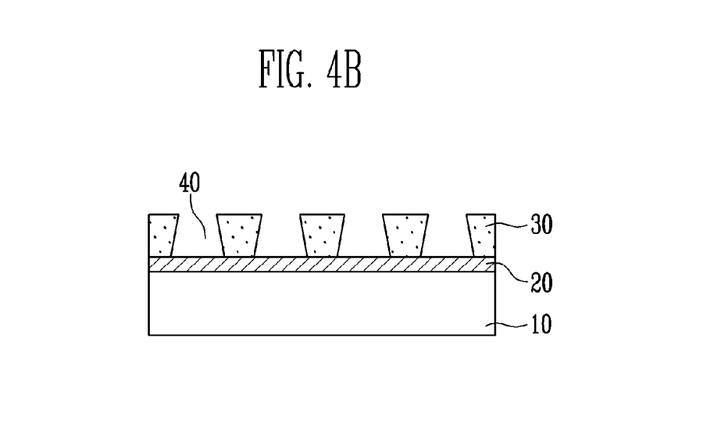

FIGS. 4A and 4B are views illustrating a photoresist removing region forming step in the method of manufacturing the touch sensing panel according to an embodiment of the present invention. FIG. 4B illustrates the section of FIG. 4A taken along the line A4-B4.

In an embodiment of the method of manufacturing the touch sensing panel, after the above-described photoresist layer forming step, the photoresist removing region forming step may be performed.

Referring to FIGS. 4A and 4B, in the photoresist removing region forming step, a plurality of photoresist removing regions 40 positioned to intersect the first electrodes 20 and to be separated from each other may be formed on the photoresist layer 30.

For example, the photoresist removing regions 40 may be longitudinally formed in the second direction (for example, the Y axis direction) to be positioned in the first direction (for example, the X axis direction).

Parts of the first electrodes 20 may be exposed through the photoresist removing regions 40 positioned in the photoresist layer 30.

The photoresist removing regions 40 may be formed using a common photolithography process.

For example, a process of exposing and developing the photoresist layer 30 using a mask (not shown) is performed so that the photoresist positioned in the photoresist removing regions 40 may be removed.

The photoresist removing regions 40 may consist of intersecting regions 41 that intersect the first electrodes 20 and coupling regions 42 for coupling the intersecting regions 41.

For example, the plurality of intersecting regions 41 that overlap the first electrodes 20 may be arranged in the second direction and the intersecting regions 41 may be coupled to each other by the coupling regions 42.

The intersecting regions 41 adjacent to the first electrodes 20 preferably have a first width W1, and a second width W2 larger than the first width W1.

Figure 5A:
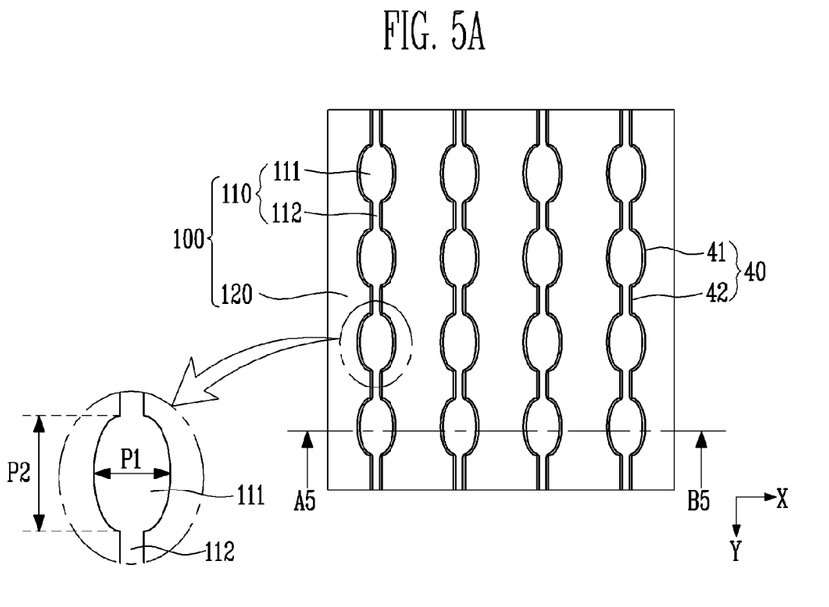
FIGS. 5A and 5B are views illustrating a tunneling magnetoresistance (TMR) element layer forming step in the method of manufacturing the touch sensing panel according to the embodiment of the present invention.

The above is for defining the shapes of TMR patterns 110 and second electrodes 210 to be formed in subsequent processes (see, for example, FIG. 5A).

In addition, the first width W1 of the intersecting regions 41 and the second width W2 of the intersecting regions 41 may be set to be perpendicular to each other.

For example, the intersecting regions 41 having a large width and a small width may be elliptical as illustrated in FIG. 4A. The intersecting regions 41 may be diamond-shaped in other embodiments.

The coupling regions 42 for coupling the intersecting regions 41 may be positioned to be adjacent to the substrate 10. In addition, the width of the coupling regions 42 is preferably set to be smaller than the widths W1 and W2 of the intersecting regions 41. The photoresist removing regions 40 may be formed so that the width thereof is reduced from the bottom toward the top. For this purpose, the photoresist layer 30 is preferably formed of a negative type photoresist.

Figure 5B:
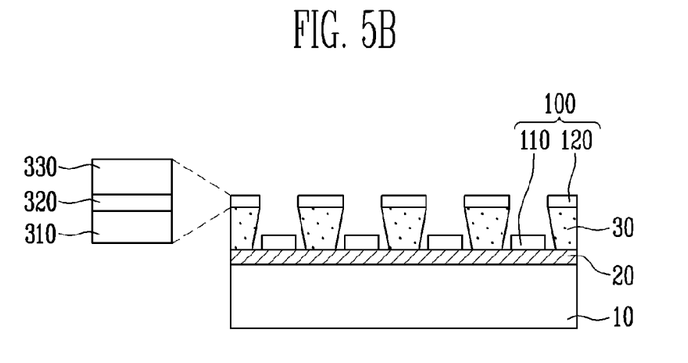

FIGS. 5A and 5B are views illustrating a tunneling magnetoresistance (TMR) element layer forming step in the method of manufacturing the touch sensing panel according to the embodiment of the present invention. FIG. 5B illustrates the section of FIG. 5A taken along the line A5-B5.

In an embodiment of the method of manufacturing the touch sensing panel, after the above-described photoresist removing region forming step, the TMR element layer forming step may be performed.

Referring to FIGS. 5A and 5B, in the TMR element layer forming step, a TMR element layer 100 may be formed on the photoresist layer 30. The TMR element layer 100 may be entirely laminated on the photoresist layer 30 where the photoresist removing regions 40 exist. Therefore, the TMR element layer 100 may be divided into parts 120 positioned on the photoresist layer 30 and the TMR patterns 110 positioned on the first electrodes 20 and the substrate 10 through the photoresist removing regions 40.

Due to step differences generated in the photoresist removing regions 40, the TMR element layer 100 may be divided into the plurality of TMR patterns 110.

Since the plurality of TMR patterns 110 have the same shape as the photoresist removing regions 40, the TMR patterns 110 may include first intersecting parts 111 having the same shape as the intersecting regions 41 and first coupling parts 112 having the same shape as the coupling regions 42.

The TMR patterns 110 may include the first intersecting parts 111 that intersect the first electrodes 20 and the first coupling units 112 for coupling the first intersecting parts 111.

For example, the plurality of first intersecting parts 111 that overlap the first electrodes 20 may be arranged in the second direction and the first intersecting parts 111 may be coupled to each other by the first coupling parts 112.

The first intersecting parts 111 positioned on the first electrodes 20 preferably have a first width P1, and a second width P2 larger than the first width P1.

In order to remove the memory characteristic of the TMR patterns 110, when the first intersecting parts 111 are set to have different widths, coercive force having non-linear distribution is provided so that the memory characteristic of the first intersecting parts 111 is removed.

Therefore, it is not necessary to perform a refresh operation for initialization so that the touch sensing panel may be driven at high speed.

In addition, the first width P1 of the first intersecting parts 111 and the second width P2 of the first intersecting parts 111 may be set to be perpendicular to each other.

For example, the first intersecting parts 111 having a large width and a small width may be elliptical as illustrated in FIG. 5A. In other embodiments, the first intersecting parts 111 may be diamond-shaped.

The first coupling parts 112 for coupling the first intersecting parts 111 may be positioned on the substrate 10. In addition, the width of the first coupling parts 112 is preferably set to be smaller than the widths P1 and P2 of the first coupling parts 112.

Referring to FIG. 5B, the TMR element layer 100 may include a pinned layer 310, an insulation layer 320, and a free layer 330.

The pinned layer 310 may be formed of a ferromagnetic substance. The ferromagnetic substance can be a material that is strongly magnetized in the direction of a magnetic field when a strong magnetic field is applied from the outside and that remains magnetized although the external magnetic field is removed. The pinned layer 310 is formed of the ferromagnetic substance in which a magnetizing direction does not easily change even when an external magnetic field in the opposite direction to the magnetizing direction is applied.

The insulation layer 320 may be formed of a dielectric substance. The insulation layer 320 may not be magnetized in a natural state.

The free layer 330 may be formed of a ferromagnetic substance. In the free layer 330, a magnetizing direction is controllable. Therefore, the free layer 330 may be formed of the ferromagnetic substance in which a magnetizing direction changes when an external magnetic field in the opposite direction to the magnetizing direction is applied.

The position of the pinned layer 310 and the position of the free layer 330 may be reversed. The TMR element layer 100 may have a single conjunction structure of a ferromagnetic substance/an insulation substance/a ferromagnetic substance as described above.

In addition, the TMR element layer 100 may have a double conjunction structure of a ferromagnetic substance/an insulation substance/an insulation substance/a ferromagnetic substance.

Therefore, the TMR patterns 110 formed by the TMR element layer 100 may include the pinned layers 310, the insulation layers 320, and the free layers 330.

Therefore, the first intersecting parts 111 of the TMR patterns 110 may be set in two states, that is, a state in which the pinned layers 310 are magnetized in the same direction as the direction in which the free layers 330 are magnetized (hereinafter, referred to as a parallel state) and a state in which the pinned layers 310 are magnetized in a different direction from the direction in which the free layers 330 are magnetized (hereinafter, referred to as an antiparallel state). That is, 0 and 1 may be distinguished using the parallel state and the antiparallel state.

As a result, since the direction in which the free layers 330 are magnetized may be changed by the magnetic field applied from the outside, a user may set the state of the first intersecting parts 111 using a stylus pen capable of emitting a magnetic field.

For example, since the first intersecting parts 111 are in a high resistance state when the first intersecting parts 111 in a specific position are stimulated by the stylus pen to be transited to the antiparallel state, the position of the first intersecting parts 111 may be detected through the first electrodes 20 and the second electrodes 210 coupled to the first intersecting parts 111. Therefore, the contact (or approach) position of the stylus pen may be detected.

In addition, since the widths P1 and P2 of the first intersecting parts 111 are set to be different from each other so that the memory characteristic of the first intersecting parts 111 is removed, the first intersecting parts 111 may be returned to an initial state (for example, the parallel state) in a predetermined time without an additional refresh operation.

Figure 6A:
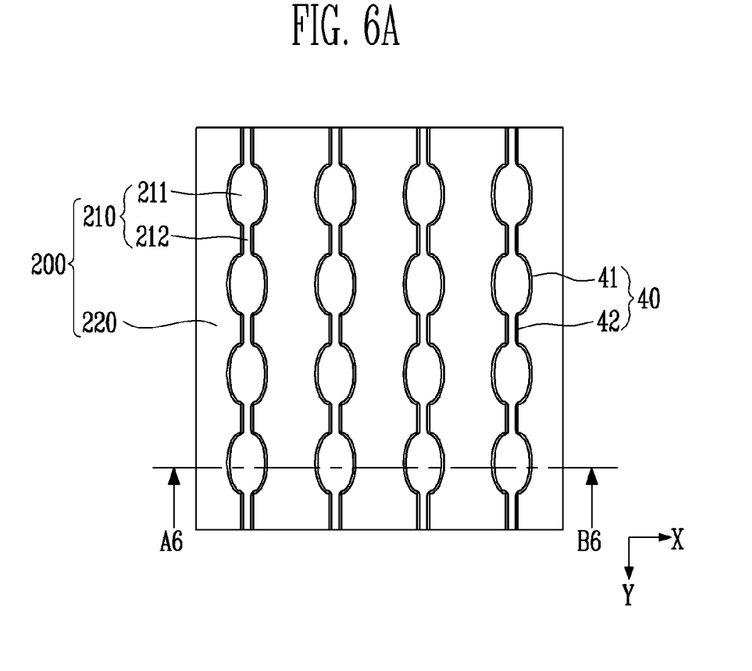
FIGS. 6A and 6B are views illustrating a second electrode layer forming step in the method of manufacturing the touch sensing panel according to the embodiment of the present invention.
Figure 6B:
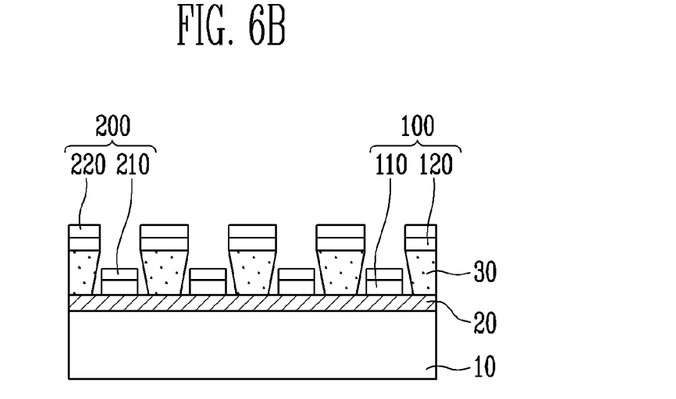

FIGS. 6A and 6B are views illustrating a second electrode layer forming step in the method of manufacturing the touch sensing panel according to an embodiment of the present invention. FIG. 6B illustrates the section of FIG. 6A taken along the line A6-B6.

In an embodiment of the method of manufacturing the touch sensing panel, after the above-described TMR element layer forming step, the second electrode layer forming step may be performed.

In addition, the TMR element layer forming step and the second electrode layer forming step may be simultaneously performed.

For example, after laminating a second electrode layer 200 on the TMR element layer 100, the TMR element layer 100 and the second electrode layer 200 may be laminated on the photoresist layer 30.

Referring to FIGS. 6A and 6B, in the second electrode layer forming step, the second electrode layer 200 may be laminated on the TMR element layer 100.

Therefore, the second electrode layer 200 may be divided into parts 220 positioned on the photoresist layer 30 and the second electrodes 210 positioned on the TMR patterns 110 through the photoresist removing regions 40.

Due to step differences generated in the photoresist removing regions 40, the second electrode layer 200 may be divided into the plurality of second electrodes 210.

The plurality of second electrodes 210 may have the same shape as the photoresist removing regions 40 and the TMR patterns 110.

Therefore, the plurality of second electrodes 210 may include second intersecting parts 211 having the same shape as the first intersecting parts 111, and second coupling parts 212 having the same shape as the first coupling parts 112.

The second electrodes 210 may consist of the second intersecting parts 211 positioned on the first intersecting parts 111, and the second coupling parts 212 positioned on the first coupling parts 112 to couple the second intersecting parts 211 to each other.

For example, the plurality of second intersecting parts 211 may be arranged in the second direction and may be coupled to each other by the second coupling parts 212.

As a result, the first intersecting parts 111 of the TMR patterns 110 may be arranged in a matrix between the plurality of first electrodes 20 and the plurality of second electrodes 210, and the position of the first intersecting parts 111 whose states are changed by an external magnetic field may be detected through the first electrodes 20 and the second electrodes 210 that intersect each other.

Figure 7:
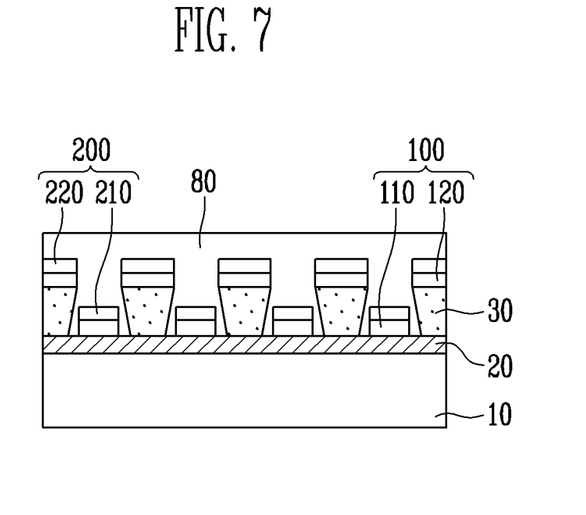
FIG. 7 is a view illustrating a protective layer forming step in the method of manufacturing the touch sensing panel according to the embodiment of the present invention.

FIG. 7 is a view illustrating a protective layer forming step in the method of manufacturing the touch sensing panel according to an embodiment of the present invention.

After the above-described TMR element layer forming step and second electrode layer forming step, the protective layer forming step may be performed.

Referring to FIG. 7, in the protective layer forming step, a protective layer 80 may be formed on the second electrode layer 200.

The protective layer 80 may be entirely laminated on the substrate 10. Therefore, components such as the second electrodes 210 positioned in the touch sensing panel may be protected.

As described above, in the method of manufacturing the touch sensing panel according to embodiments of the present invention, only the photolithography process is performed twice.

A first mask process is performed in the first electrode forming step related to FIGS. 2A and 2B, and a second mask process is performed in the photoresist removing region forming step related to FIGS. 4A and 4B.

Therefore, since the number of mask processes may be reduced to two in comparison with the conventional manufacturing method, manufacturing cost and manufacturing time may be reduced.

While the present invention has been described in connection with certain embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A method of manufacturing a touch sensing panel, comprising:
    providing a substrate;
    forming a plurality of first electrodes arranged on the substrate to be separated from each other;
    forming a photoresist layer on the plurality of first electrodes;
    forming a plurality of photoresist removing regions positioned to intersect the first electrodes and to be separated from each other on the photoresist layer; and
    forming a tunneling magnetoresistance (TMR) element layer and a second electrode layer comprising a plurality of second electrodes on the photoresist layer.

2. The method as claimed in claim 1, wherein the TMR element layer is divided into parts positioned on the photoresist layer and TMR patterns positioned on the first electrodes and the substrate through the photoresist removing regions.

3. The method as claimed in claim 2, wherein the second electrode layer is divided into parts positioned in the photoresist layer and second electrodes positioned on the TMR patterns through the photoresist removing regions.

4. The method as claimed in claim 3, further comprising forming a protective layer on the second electrode layer.

5. The method as claimed in claim 3, wherein the TMR patterns are formed to have the same shape as the photoresist removing regions.

6. The method as claimed in claim 5, wherein the second electrodes have the same shape as the TMR patterns.

7. The method as claimed in claim 2, wherein the TMR patterns comprise:
    first intersecting parts that intersect the first electrodes; and first coupling parts for coupling the first intersecting parts to each other.

8. The method as claimed in claim 7, wherein the first intersecting parts have a first width in a first direction and a second width in a second direction, wherein the second width is larger than the first width.

9. The method as claimed in claim 8, wherein the first width is perpendicular to the second width.

10. The method as claimed in claim 8, wherein the first intersecting parts are elliptical or diamond-shaped.

11. The method as claimed in claim 7, wherein the second electrodes have the same shape as the TMR patterns.

12. The method as claimed in claim 1, wherein the photoresist removing regions comprise intersecting regions that intersect the first electrodes and coupling regions for coupling the intersecting regions to each other.

13. The method as claimed in claim 12, wherein the intersecting regions have a first width in a first direction, and a second width in a second direction, wherein the second width is larger than the first width.

14. The method as claimed in claim 13, wherein the first width is perpendicular to the second width.

15. The method as claimed in claim 13, wherein the intersecting regions are elliptical or diamond-shaped.

16. The method as claimed in claim 1, wherein the second electrode layer is positioned on the TMR element layer.

\* \* \* \* \*